US010274821B2

(12) United States Patent
Morishita et al.

(10) Patent No.: US 10,274,821 B2
(45) Date of Patent: Apr. 30, 2019

(54) MASK AND MANUFACTURING METHOD OF MASK

(71) Applicant: Toshiba Memory Corporation, Tokyo (JP)

(72) Inventors: Keiko Morishita, Yokohama Kanagawa (JP); Shingo Kanamitsu, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 122 days.

(21) Appl. No.: 15/449,853

(22) Filed: Mar. 3, 2017

(65) Prior Publication Data

US 2017/0269471 A1 Sep. 21, 2017

(30) Foreign Application Priority Data

Mar. 15, 2016 (JP) ................................ 2016-051687

(51) Int. Cl.

*G03F 1/24* (2012.01)
*G03F 1/72* (2012.01)
*G03F 1/84* (2012.01)
*H01L 21/66* (2006.01)
*H01L 21/027* (2006.01)

(52) U.S. Cl.

CPC .................. *G03F 1/72* (2013.01); *G03F 1/24* (2013.01); *G03F 1/84* (2013.01); *H01L 21/0274* (2013.01); *H01L 22/20* (2013.01)

(58) Field of Classification Search

CPC ................. G03F 1/24; G03F 1/72; G03F 1/84
USPC ........................................................ 430/5, 30
See application file for complete search history.

(56) References Cited

U.S. PATENT DOCUMENTS 9,280,043 B2 3/2016 Lamantia
2006/0292459 A1 12/2006 Kamm et al.
2012/0066651 A1* 3/2012 Pang ........................ G03F 1/00 716/52
2014/0254913 A1* 9/2014 Pang ........................ G03F 1/70 382/144

FOREIGN PATENT DOCUMENTS

JP 2000031021 A 1/2000
JP 2006352134 A 12/2006
JP 2014165275 A 9/2014
WO 2012133109 A1 10/2012

* cited by examiner

*Primary Examiner* — Christopher G Young
(74) *Attorney, Agent, or Firm* — Kim & Stewart LLP

(57) ABSTRACT

A mask includes a plurality of line patterns provided on a substrate, the plurality of line patterns each including a line comprising a plurality of first layers and a plurality of second layers alternately stacked on the substrate. The lines of the plurality of line patterns extend in a first direction and the lines of the plurality of line patterns are spaced in a second direction crossing the first direction. A line of one of the plurality of line patterns has a first portion and a second portion on a side of the first portion in the first direction, the first portion wider than the second portion in the second direction.

10 Claims, 9 Drawing Sheets

110
20
C1
B1
B2
10
A1
A2
Z
Y
X
20a
PT1
C2
20b
26

20(20a)
ML
27
23
22 21 22
22
21
ML
21
22
21
20
(20b)
10
40

AA
20(20b)
27
10

20(20b)
26
20(20a)
P1
P2
21rb
21ra
40

MASK AND MANUFACTURING METHOD OF MASK

CROSS-REFERENCE TO RELATED APPLICATIONS

This application is based upon and claims the benefit of priority from Japanese Patent Application No. 2016-051687, filed on Mar. 15, 2016, the entire contents of which are incorporated herein by reference.

FIELD

Embodiments described herein relate generally to a mask and a method of manufacturing a mask.

BACKGROUND

Defects may be formed on the mask used in a lithography process. In this case, defects on the device, which is manufactured using the mask, are formed as a result of the defects on the mask.

DETAILED DESCRIPTION

Figures 1A, 1B, 1C, 1D:
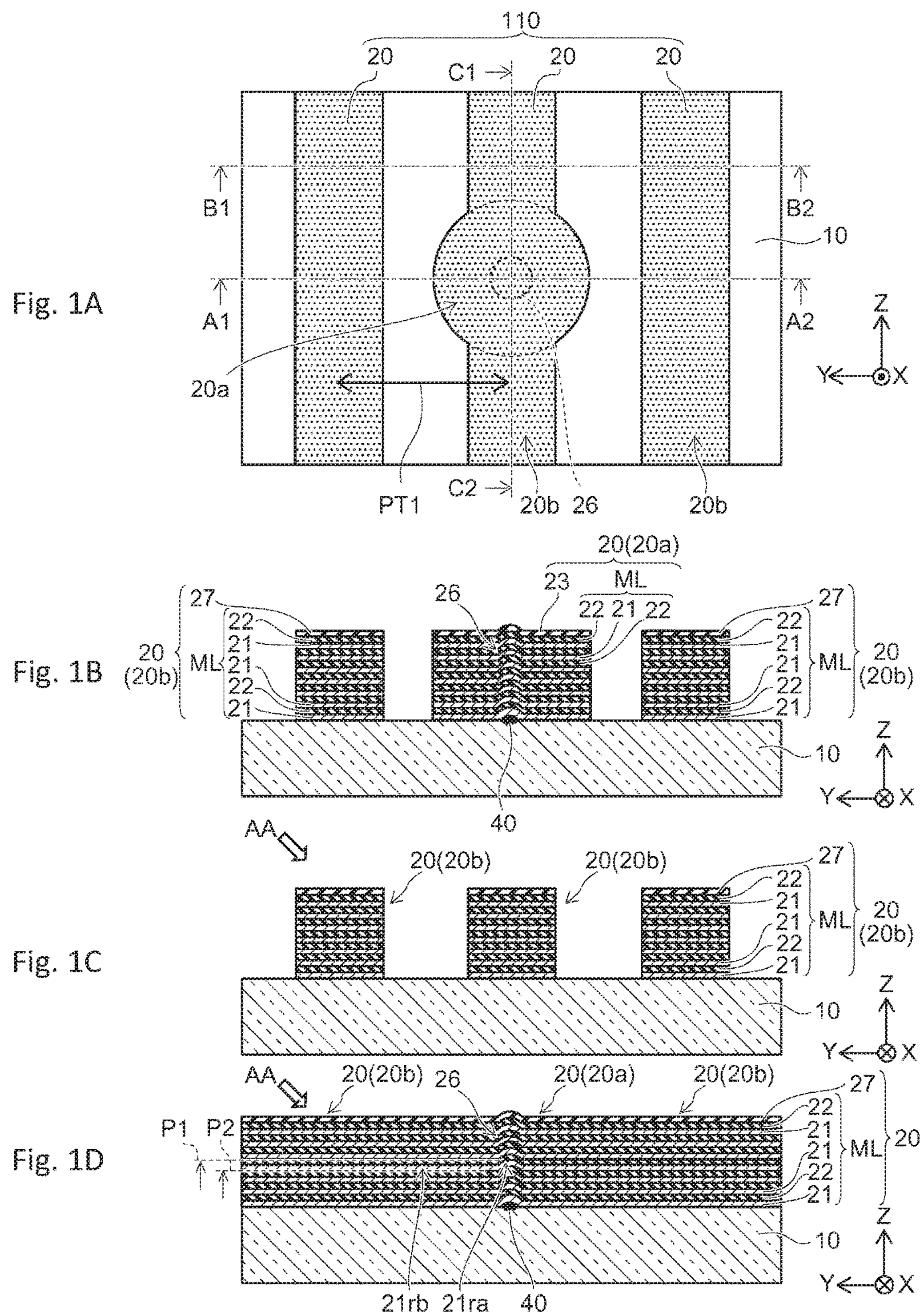
FIGS. 1A, 1B, 1C, and 1D are schematic views of an example of a mask manufactured according to embodiments.

Embodiments will now be described with reference to the drawings. The drawings are schematic or conceptual; and the relationships between the thicknesses and widths of portions shown in the drawings, the proportions of sizes between portions, etc., are not necessarily the same as the values thereof in an actual mask. The dimensions and/or the proportions may be illustrated differently between the drawings, even in the case where the same portion is illustrated. The same portions within the various drawings are marked with the same numerals and letters, and a repeated detailed description is omitted as appropriate, and primarily the different portions are described.

A mask according to an embodiment includes a plurality of line patterns provided on a substrate, the plurality of line patterns each including a line comprising a plurality of first layers and a plurality of second layers alternately stacked on the substrate. The lines of the plurality of line patterns extend in a first direction and the lines of the plurality of line patterns are spaced in a second direction crossing the first direction. A line of one of the plurality of line patterns has a first portion, and a second portion located on a side of the first portion in the second direction, the first portion wider than the second portion in the second direction.

FIGS. 1A, 1B, 1C, and 1D are schematic views of examples of a mask manufactured according to embodiments. FIG. 1A is a schematic plan view which is viewed in the direction of arrow AA. FIGS. 1B, 1C, and 1D are sectional views along lines A1-A2, B1-B2 and C1-C2 of the mask of FIG. 1A, respectively.

As shown in FIG. 1A, the mask 110 includes a plurality of line patterns 20. The plurality of line patterns 20 are formed on the substrate 10. The substrate 10 includes quartz.

For example, the individual lines 20 of the plurality of line patterns 20 extend in a first direction. The plurality of lines of the line patterns 20 are spaced apart in a second direction intersecting the first direction.

The first direction is taken as an X-direction. One direction perpendicular to the X-direction is taken as a Y-direction. The second direction is corresponding to the Y-direction in a sample of the FIG. 1A.

Individual lines among the plurality of line patterns 20 are spaced from one another at a pitch (first pitch PT1). The plurality of line patterns 20 are line and space patterns. The plurality of line patterns 20 have line portions which have one reflectivity with respect to an EUV (Extreme Ultraviolet) illumination and space portions therebetween which have a different reflectivity than the line portions. The first pitch PT1 is defined, for example, as the distance between the center of one line of plurality of line patterns 20 and the center of an adjacent line of the plurality of line patterns 20 in the second direction (Y-direction).

As shown the FIG. 1B, the plurality of line patterns 20 each include a stacked body ML. The stacked body ML includes a plurality of first layers 21 and a plurality of second layers 22. The plurality of first layers 21 and the plurality of second layers 22 are stacked in a third direction. The plurality of first layers 21 and the plurality of second layers 22 are alternately stacked. The third direction corresponds to the Z-direction in FIG. 2.

Mask 110 is, for example, an EUV mask. An EUV mask is used for EUV lithography (Extreme Ultraviolet Lithography: EUVL). EUV is used as the exposure light (energy) in EUV lithography. A wave length of the exposure light is, for example, about 13.5 nm. The mask 110 is, for example, a reflective EUV mask. The plurality of the first layers 21 and the plurality of the second layers 22 reflect the EUV energy received thereat.

In one embodiment, the widest width, in the Y direction, of a line in a portion of the plurality of line patterns 20 (first portion 20*a*) in the Y direction is larger than the width in the Y direction of another portion of the same line among the plurality of the line patterns 20 (first portion 20*b*). Thereby, generation of a defect in workpiece formed using the mask can be decreased (controlled).

That is, the plurality of line patterns 20 are originally formed with substantially the same line width. However, in the process of the manufacturing the mask 110, a foreign material (particle 40 shown in the FIG. 1B) may become adhered to the substrate 10. When this occurs, a phase defect is created in the line around the region where the foreign material has adhered. The phase defect is a defect which creates a disturbed circle or protrusion structure in the stacked films. A multilayer film in a line pattern having the phase defect has a different periodic structure in reflection of EUV than does a periodic structure in reflection of EUV of a multilayer film in a fine (normal) line pattern 20 (line pattern 20 which does not have the phase defect). In this case, when each of the line portions of the line patterns 20 has a homogenous (uniform) film thickness, an optical property of the stack in a region where foreign material has adhered is different from an optical property in the stack around the region where foreign material has not adhered. This creates an non-homogenous (non-uniform) optical property for reflection of EUV light or energy directed to the mask. For example, a reflectivity of a portion which includes the phase defect in the line pattern 20 is lower than a reflectivity of a portion which does not include the phase defect in the line pattern 20. The reflectivity is a reflectivity of the EUV energy, and is the percentage of EUV light or energy received at the film stack which is reflected away in an intended direction. Therefore, this will create a defect in a workpiece processed using the mask.

In the embodiment, the width of a portion of a line (first portion 20*a*) in the plurality of the line patterns 20 is larger than the width of another portion (second portion 20*b*) of the same line in the plurality of the line patterns 20. As shown in the FIG. 1B, the first portion 20*a* is, for example, a portion where foreign material exists. On the other hand, the second portion 20*b* is a portion where the foreign material does not exist. In the embodiment, a width of the first portion 20*a* is locally larger than a width of the second portion 20*b*. Therefore, generating a defect in a workpiece can be controlled by locally increasing the reflection area around a defect to compensate for light scattered as a result of the presence of the defect.

The second portion 20*b* is, for example, a fine portion (a normal portion). The first portion 20*a* is a portion which is locally enlarged. The locally enlarged portion corresponds to a modified (corrected) portion. By enlarging the portion, an effect of the foreign material is controlled and generation of a defect in the workpiece made using the mask is controlled.

In the embodiment, a case which the foreign material is present and a case which the foreign material is not present may exist. For example, in a case where the foreign material is small, or in a case where a property of the foreign material is similar to a property of a region around the foreign material, it may be difficult to observe the foreign material.

Below is a description of examples of the foreign material and the defect attributed in the foreign material.

For example, as shown in the FIG. 1B, a particle (foreign material) 40 exists between the first portion 20*a* of the line pattern 20 and the substrate 10. For example, the particle 40 is present in the first portion 20*a*. In this sample, the particle 40 is not present between the second portion 20*b* and substrate 10.

As shown in the FIG. 1D, one of a plurality of first layers 21 includes the first portion 20*a* in a first region 21*ra* in and the second portion 20*b* in a second region 21*rb*. The height of the first region 21*ra* is different from the height of the second region 21*rb*. That is, a position (first position p1) of the first region 21*ra* is different from a position (second position p2) of the second region 21*rab* in the Z-direction (a third direction which the plurality of the first layers 21 and the plurality of the second layers 22 are stacked). For example, the second region 21*rb* does not overlap the location of the particle 40 in the Z-direction.

For example, a defect (phase defect portion) 26 is generated due to the presence of the particle 40. For example, the first portion 20*a* has a defective portion (phase defect portion) 26. The first portion 20*a* overlies the particle 40 in Z-direction. On the other hand, the second portion 20*b* does not overlie the particle 40 in Z-direction. In this sample, a height of an upper surface of the stack of first and second layers 21, 22 on the defective portion 26 is different from a height of an upper surface of the stack of first and second layers 21, 22 on the second portion 20*b*. For example, the upper surface on the defective portion 26 is a convex surface. For example, a surface roughness of the upper surface on the first portion 20*a* is rougher than a surface roughness of the upper surface on the second portion 20*b*.

For example, a reflectivity of the first portion 20*a* including the defect potion 26 is lower than a reflectivity of the second portion 20*b*. The reflectivity of the first portion 20*a* and the reflectivity of the second portion 20*b* are the reflectivity of the portions with respect to EUV energy or light.

As described above, in the case where the phase defect is generated in an EUV mask, the intensity of EUV reflection (reflected light) reaching an intended location on the workpiece being processed with the mask from the defective portion 26 is lower than an intensity of EUV reflection (reflected light) from a portion of the mask in which the phase defect does not exist. Therefore, a defect (device defect) may be generated in the workpiece processed by the mask 110 in the EUV lithography.

In the mask 110 which relates to the embodiment, the width of the first portion 20*a* which includes the defective portion 26 is made larger than the width of the second portion 20*b*. A reflecting area of the first portion 20*a*, which includes the defective portion 26, is locally larger than a reflecting area of the line adjacent to the first portion 20*b*. In the embodiment, a localized reduction of the intensity in EUV reflectivity as a result of the defective portion 26 can thus be offset. The depression of the intensity in EUV reflectivity is due to the phase defect. Therefore, the defect occurring on the workpiece processed with the mask can be controlled during the EUV lithography.

In the embodiment, the distance between the side of the first portion 20*a* of a line and a non-defective portion of an adjacent line 20 is 0.1 to 0.8 times the distance between the second portion 20*b* of the same line and the same adjacent line 20. In case the distance is smaller, the negative impact on the mask due to the presence of the foreign material cannot be offset. In the case the distance is too large, the negative impact due to the first portion 20*a* can still be great.

On the other hand, the length of the first portion 20*a* in the X-direction is shorter than the length of the second portion 20*b* in the X-direction. That is, the portion which is modified (corrected) is a local, small portion of the line 20. The first portion 20*a* is adjacent to, and overlies, the particle 40.

In the embodiment, the first layer 21 includes molybdenum (Mo), for example. Furthermore, in this example, a third layer 27 is supplied on a stacked body ML. The third layer 27 is, for example, a capping layer. The third layer 27 includes, for example, ruthenium (Ru). In the mask 110, the third layer 27 may not be supplied.

Manufacturing Method According to First Embodiment

A mask production method according to the first embodiment is described herein. For example, the mask of FIG. 1 can be obtained.

FIGS. 2 A, 2B, 2C, 3A, 3B, 4A, and 4B are schematic diagrams illustrating an example of a mask manufacturing method according to the first embodiment.

Figure 5:
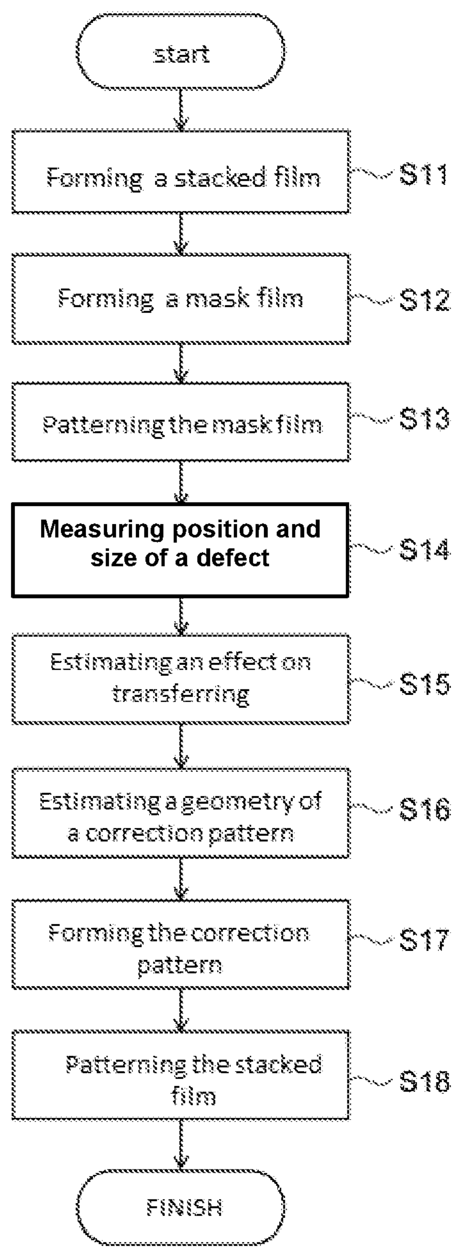
FIG. 5 is a flowchart illustrating an example of a mask manufacturing method according to the first embodiment.

FIG. 5 is a flowchart illustrating an example of a mask manufacturing method according to the first embodiment.

Figure 2A:
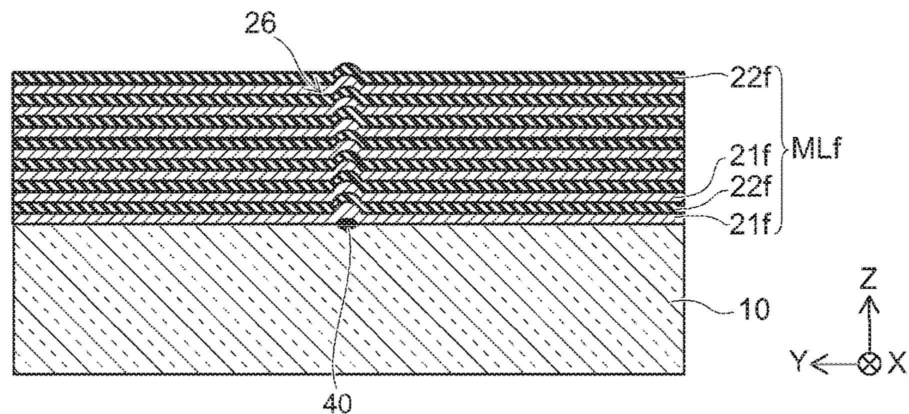
FIGS. 2A, 2B, and 2C are schematic views of an example of a mask manufacturing method according to a first embodiment.
Figure 2B:
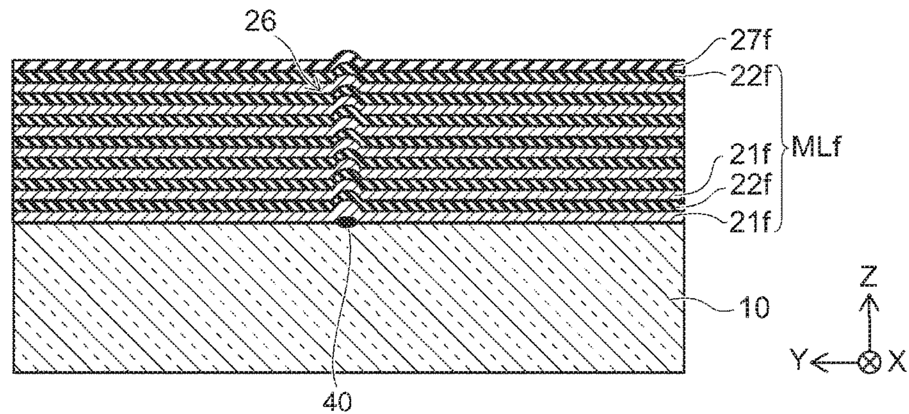
Figure 2C:
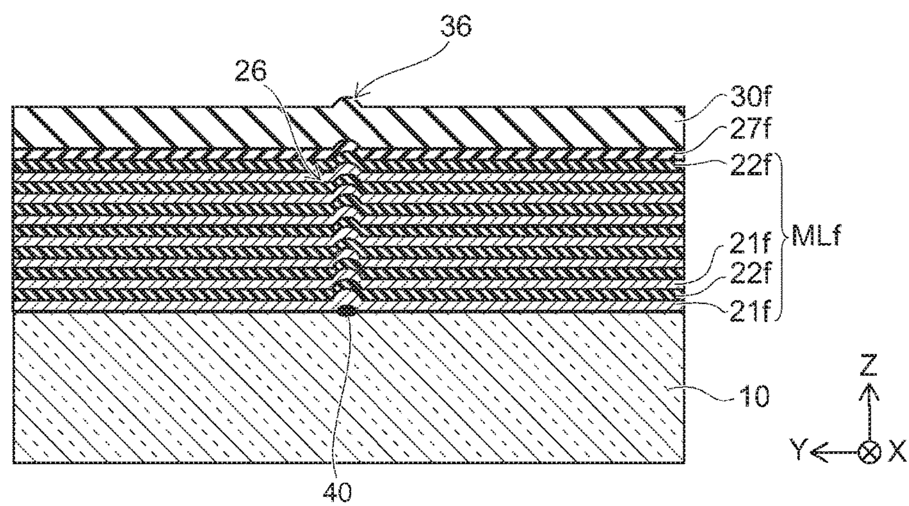
Figure 3A:
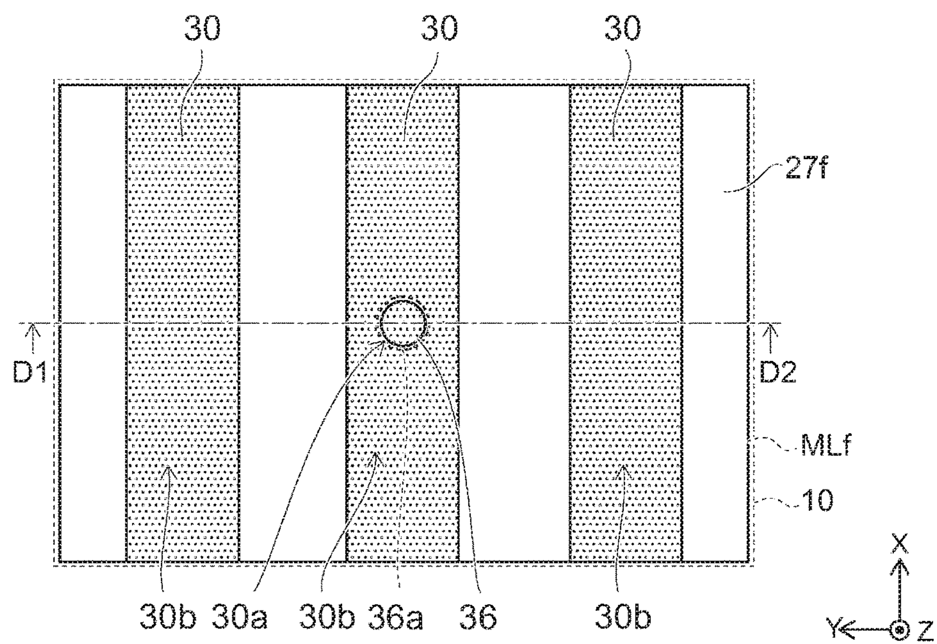
FIGS. 3A and 3B are schematic views of an example of a mask manufacturing method according to the first embodiment.
Figure 3B:
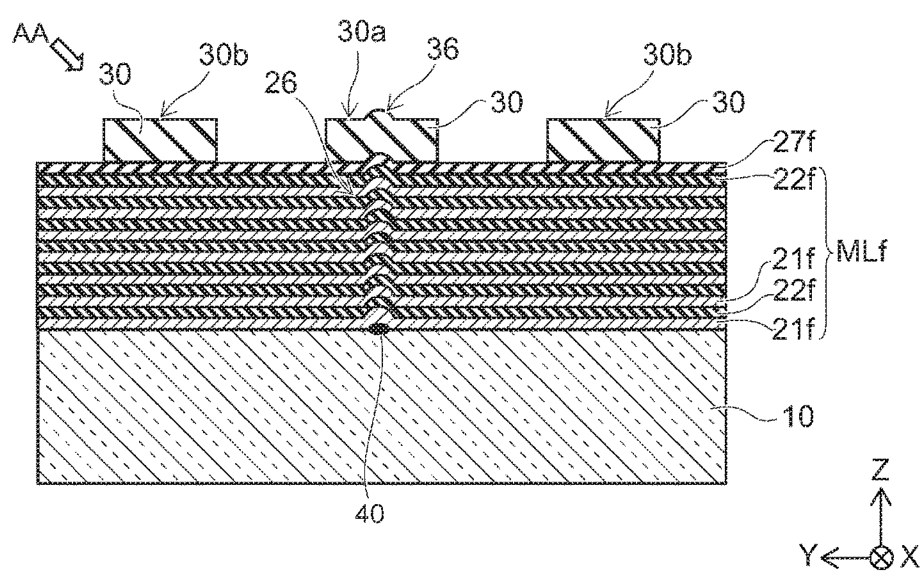
Figure 4A:
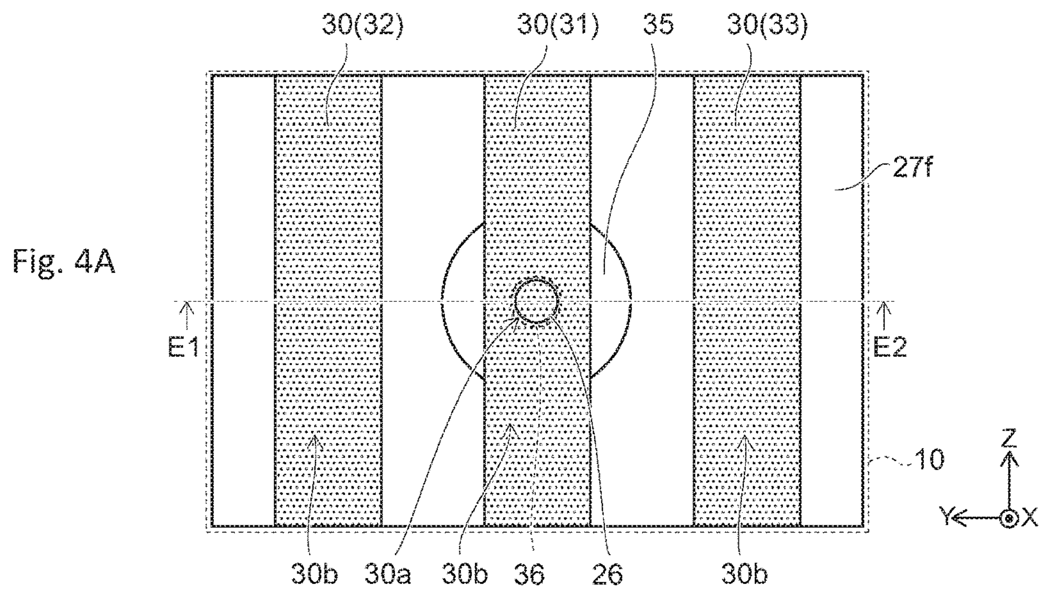
FIGS. 4A and 4B are schematic views of an example of a mask manufacturing method according to the first embodiment.
Figure 4B:
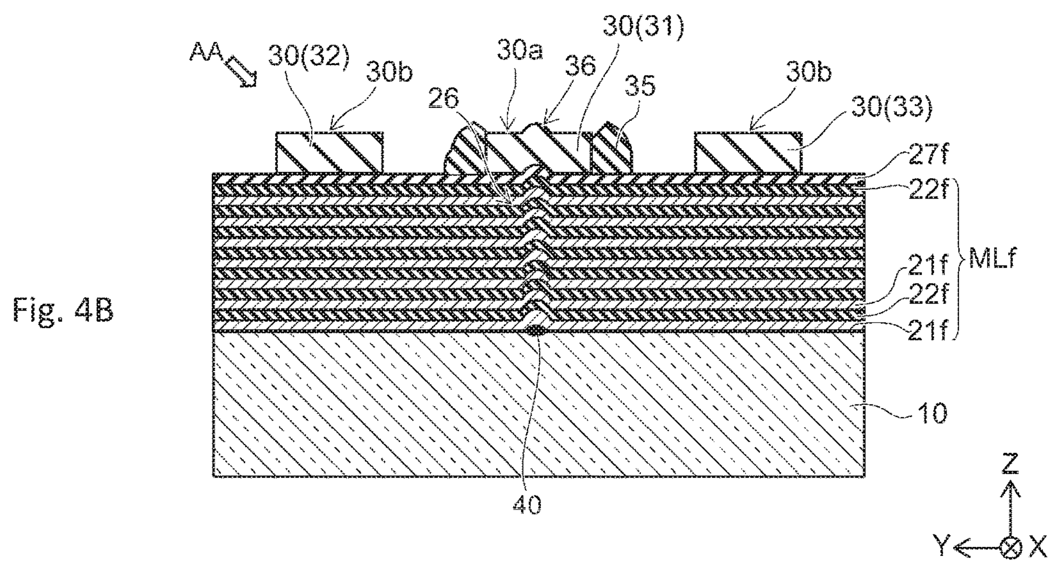

FIGS. 2A, 2B, 2C, 3B, and 4B are schematic sectional views. FIG. 3A is a schematic plan view viewed in the direction of arrow AA of FIG. 3B. FIG. 3B is a sectional view along line D1-D2 of FIG. 3A. FIG. 4A is a plan view viewed in the direction of arrow AA in FIG. 4B. FIG. 4B is a sectional view along line E1-E2 in FIG. 4A.

As shown in FIG. 2A, a stacked film MLf is formed on the substrate 10 (step S11 in FIG. 5). For example, the substrate includes quartz. The stacked film MLf includes a plurality of first films 21*f* and a plurality of second films 22*f* alternately formed. For example, the first film includes molybdenum (Mo). For example, the second film 22*f* includes silicon (Si). For example, a particle may be trapped between the substrate 10 and the stacked film MLf. The particle may be trapped within the layers of the stacked film MLf. As shown FIG. 2A, a defective portion 26 is generated due to the presence of the particle 40. The defective portion 26 causes a phase defect on the mask.

As shown in FIG. 2B, for example, a third film (capping film) 27*f* is formed on the stacked film MLf. The third film 27*f* includes, for example, ruthenium (Ru). A mask film 30*f* is formed over the third film 27*f* and includes, for example, tantalum (Ta). The mask film 30*f* is, for example, a hard mask. (Step S12 in FIG. 5). The mask film 30*f* has a mask defect region 36. The mask defect region 36 overlies the defective portion 26 in Z-direction.

As shown FIG. 3A, the mask film is patterned (step S13 in FIG. 5). For example, a resist pattern (not illustrated) is formed on the mask film 30*f*. For example, the mask film 30*f* is etched to form a mask (For example, by plasma etching). Thus, for example, the mask film is processed into a line and space pattern. Therefore, the mask film 30*f* is processed in the same pattern as the plurality of mask line patterns 30. The plurality of the mask line patterns 30 lie (are spaced) with a pitch (first pitch PT1) in the Y-direction. Each of the patterns in the plurality of the mask line patterns 30 extend in the X-direction, respectively.

One of the lines in the plurality of mask line patterns 30 includes a first mask portion 30*a* and a second mask portion 30*b* as shown in FIG. 3B. The first mask portion 30*a* includes a mask defect region 36. At least a part of the portion of the line of the first mask portion 30 overlies the defective portion 26 in Z-direction.

After patterning of the mask film is performed (step S13 in FIG. 5), for example, a position of the defect and a size of the defect are measured (step S14 in FIG. 5), data relating to the result of the measurement is obtained, and an effect on a pattern transferring process using the mask with the defect is calculated based the data (step S15 in FIG. 5). A geometry (shape or configuration or feature size) to be formed to offset the effect of the defect on EUV reflection is estimated (step S16 in FIG. 5). A sample related to these processes is described later.

As shown in FIG. 4A, a correction (modifying) pattern 35 is formed around the defective portion 26 (step S17 in FIG. 5). The correction (modifying) pattern 35 is formed on the sides of the first mask portion 30*a* and between the second mask portions 30*b* of the mask line pattern 30 to either side of first mask portion 30*a*. The correction (modifying) pattern 35 includes, for example, at least one of tantalum or silicon oxide. The mask line pattern 30 of second mask portion 30*b* is next to the one mask line pattern 30 of the first mask portion 30*a*. For example, the correction (modifying) pattern 35 is connected to the first mask portion 30*a*. The correction (modifying) pattern 35 is formed spaced from the mask line pattern 30 of the second mask portion 30*b* in the X direction. The correction (modifying) patterns 35 are formed on both sides of the first portion 20*a* in the Y-direction.

As shown in FIG. 4B, a position of a part of the correction (modifying) pattern 35 extends to either side of the position of the defect 26 in X-direction.

As shown in FIG. 1A, the third film 27*f* and the stacked film MLf are patterned (etched) (step S18 in FIG. 5). In this case, the mask line pattern 30 and correction (modifying) pattern 35 are used as masks. Thereby, the third film 27*f* and the stacked film MLf are processed into a plurality of line patterns 20. By this processing, the first film 21*f* becomes a first layer 21, and the second film 22*f* becomes a second layer 22. The third film 27*f* becomes a third layer 27. The stacked film MLf becomes a stacked body.

In the stacked body, the portion of the stacked body and the third film 27*f* masked by the first mask portion 30*a* and the correction (modifying) pattern 35 becomes a first portion 20*a*. A portion of the stacked body and the third film 27*f* masked by the second mask portion 30*b* becomes a second portion 20*b*. Thereby, a mask 110 is formed.

As a reference, to solve the problem due to the mask stacked body defect, there is another EUV mask manufacturing method. The other EUV mask manufacturing method includes, for example, removing a portion of the stacked body and forming a new portion of the stacked body at the location corresponding to the portion including the foreign material, and thereby modifying the EUV mask. However it is difficult to conduct the other EUV mask manufacturing method because a quite high precision technique is required.

In the embodiment, for example, the correction (modifying) pattern 35 is formed after patterning the mask film 30*f* (ex. hard mask) on the stacked film MLf. Forming the correction (modifying) pattern 35 is conducted before patterning the stacked film 35MLf. By using the correction (modifying) pattern 35 in addition to the mask film 30*f* as the portion of the hard mask surrounding the defect portion 36, the first portion 20*a* including the defect 26 is formed. The width of the first portion 20*a* is wider than the width of the second portion 20*b* in the line pitch direction. In the embodiment, the size of the line pattern 20 including the defective portion 26 is resultantly modified. As described above, it is easy to manufacture the EUV mask including a process to modify the defective portion 26. By using the mask 110, generating a defect in a device made using the mask may be reduced or eliminated.

The correction (modifying) pattern is formed in regions between the plurality of line patterns in the embodiment. For example, the plurality of the mask line patterns 30 include a first line 31, a second line 32 and a third line 33 shown in the views of FIGS. 4A and 4B. The first line 31 is formed between the second line 32 and the third line 33 (FIG. 4A). A mask defect region 36 is included in the first line 31. The correction (modifying) pattern 35 is connected to a mask defect region between the mask defect region 36 and the second line 32, and between the mask defect region 36 and the third line 33 as shown in FIGS. 4A and 4B.

Below is a description of an example of a process of step S14 to step S17 in FIG. 5.

In step S14 shown in FIG. 5, a position of the defect and a size of the defect are measured. The defect is, for example, a phase defect. The measurement is conducted with an AFM (Atomic Force Microscope) or a SEM (Scanning Electron Microscope). Information related to positions of a plurality of mask line patterns 30 and information related to a position of the defect are obtained. In addition, information related to a size of the defect may be obtained in the measurement. For example, rough information (data) related to the position of the defect may be obtained by the defect inspection in the process of the forming the stacked film MLf before the measurement with the AFM or the SEM. Data related to the position of the defect and data related to the size of the defect may be obtained by actinic measurement. In this case, the effect of the defect 26 on an EUV reflectance property of the mask line pattern 30 may be obtained.

In step S15 shown in FIG. 5, an effect on the mask image transferring process (the transferring of the mask pattern to a workpiece by EUV photolithography) on the obtained data is calculated. For example, the effect on the mask image transferring process is estimated using data related to a correlation between the pattern and the position of the defect or a correlation between the pattern and the size of the defect. Furthermore, a feature size of the correction (modifying) pattern required to offset the effect on the mask image transferring process is estimated in step S17 shown in FIG. 5. And the correction (modifying) pattern 35 is formed on the stacked film MLf based the estimated feature size of the correction (modifying) pattern. The reflectivity of the defect portion in the EUV mask is lower than the reflectivity of a portion of the line which does not include a phase defect. A reflectivity of the defective portion 26 and the reflectivity of the non-defective portion are reflectivities with respect to EUV energy or light. Thereby, in step S17 as shown in FIG. 5, the mask film MLf is modified (corrected) in such a way to enlarge the portion extending to the sides of the defective portion 26 in the stacked film MLf in the Y direction in the later processing process. In this case, the mask line pattern 30 has a portion (a part of the third film 27*f*) which overlies the defective portion 26 in the Z-direction as shown in FIG. 4B. A correction (modifying) pattern 35 is formed around that portion (a part of the third film 27*f*). The correction (modifying) pattern 35 performs the function of an etching mask in the process of etching the stacked film MLf. The correction (modifying) pattern 35 includes, for example, the same material as a material of the mask line pattern 30. For example, the correction (modifying) pattern 35 is formed by using the TEOS (Tetraethyl orthosilicate).

Manufacturing Method According to Second Embodiment

Below is a description of a mask manufacturing method according to a second embodiment.

Figure 6A:
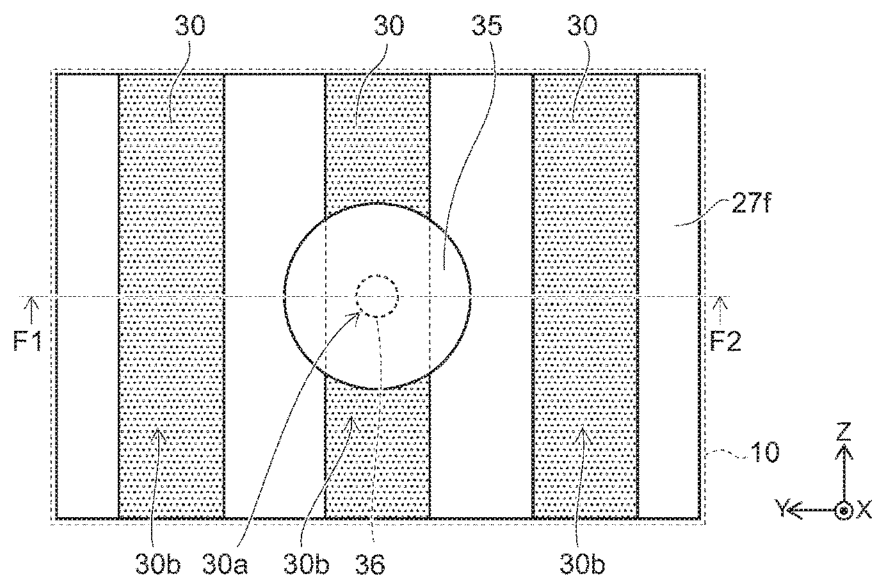
FIGS. 6A and 6B are schematic views of an example of a mask manufacturing method according to a second embodiment.
Figure 6B:
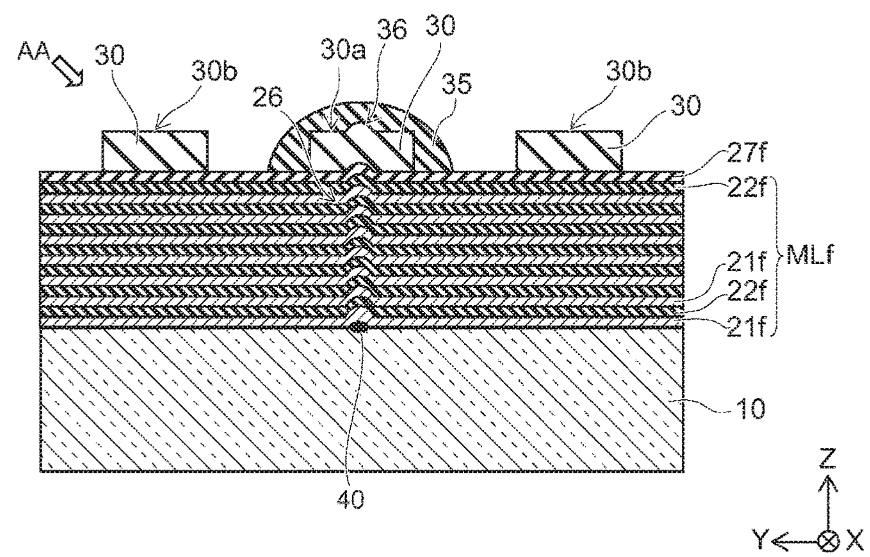

FIGS. 6A and 6B are schematic views illustrating the mask manufacturing method according to the second embodiment.

FIG. 6A is a plan view viewed in the direction of arrow AA in FIG. 6B.

FIG. 6B is a sectional schematic view along line F1-F2 of FIG. 6B.

At first, in the second embodiment, processes shown in FIGS. 2A, 2B, 20, 3A, and 3B are conducted.

Next, a correction (modifying) pattern 35 is formed to cover a portion of a line 30*b* above the defective portion 26 in the mask line pattern 30. The correction (modifying) pattern 35 is also formed in a portion of the region between the line 30*b* and the lines 30*b* of the mask line patterns 30 which are next to the one mask line pattern 30 on either side thereof. As shown in FIG. 6, at least a part of the mask line pattern 30 overlies the defective portion 26 in the Z-direction.

In the embodiment, the correction (modifying) pattern 35 is also formed above the defective portion 26. Therefore, it is easier to form the correction (modifying) patterns 35 than selectively forming the correction (modifying) patterns 35 on both sides of the first mask portion 30*a*.

Manufacturing Method According to Third Embodiment

The third embodiment is related to a mask manufacturing method. In the manufacturing method according to the third embodiment, drawing data is modified based on the defect. That is, a drawing pattern is modified. For example, the mask described in the first embodiment is obtained by this manufacturing method.

Figure 7:
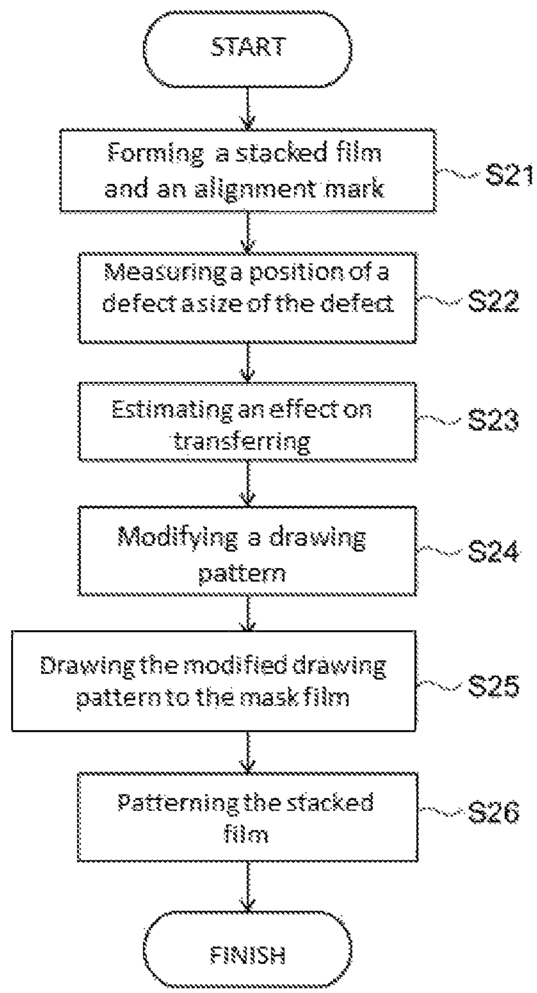
FIG. 7 is a flowchart illustrating an example of a mask manufacturing method according to a third embodiment.

FIG. 7 is a flowchart illustrating an example of a mask manufacturing method according to the third embodiment.

Figure 8A:
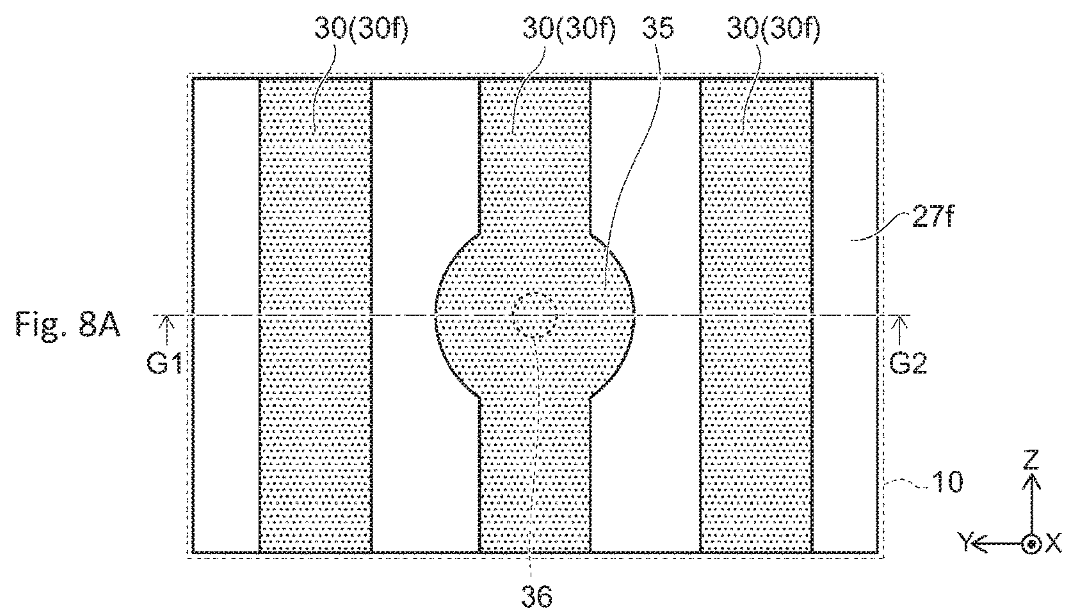
FIGS. 8A and 8B are schematic views of an example of a mask manufacturing method according to the third embodiment.
Figure 8B:
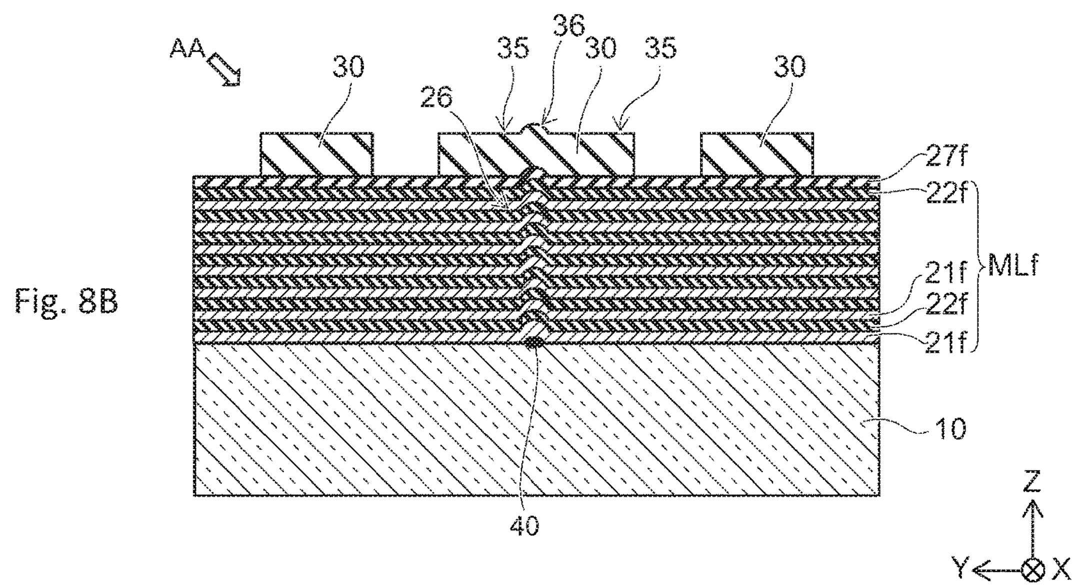

FIGS. 8A and 8B are schematic diagrams illustrating an example of a mask manufacturing method according to the third embodiment.

As discussed in FIG. 7, a stacked film MLf, a mask film 30*f* and an alignment mark are formed in the mask manufacturing method according to the embodiment (step S21). For example, the alignment mark is formed on the substrate 10. The alignment mark may be formed on the stacked film MLf which is formed on the substrate 10. The alignment mark is used for a position adjustment in the process of drawing the drawing data and the process of checking the defect. For example, by using the alignment mark in the position adjustment, it become possible to conduct the position adjustment with accuracy not less than 10 nm and less than 100 nm. The alignment mark is formed, for example, on a region that does not interfere with the exposure region in the EUV lithography process to process the substrate 10.

The stacked film MLf and the mask film 30*f* is checked (step S22). In this process, a position of the defect (phase defect) and a size of the defect are estimated.

An effect on the image transferring in the lithography process is then estimated (step S23). The effect on the image transferring is due to the defect which is detected. For example, data which is obtained as a result of the checking and the drawing data are compared. And the effect on image transferring in the lithography process is estimated. The effect is due to the defect. And data of a defective portion 26 is extracted. The effect on image transferring during the lithography is, for example, decreasing an intensity of reflection (reflected light). The effect on image transferring is due to the defective potion 26.

Drawing data for writing the image pattern on the resist pattern on the mask film 30*f* is modified based on data related to the defect which is detected in the checking process (step S24). The drawing pattern is modified based on the defect (defect portion). For example, the feature size of the modified pattern is changed in the drawing pattern which is set in advance. Thereby, drawing data (drawing pattern data) in which the modified pattern is provided is obtained.

Furthermore, a pattern is drawn on the resist over the mask film 30*f* based on the modified drawing data (step S25). The mask line pattern 30 is formed on the mask film 30*f*. In the mask line pattern 30, a width of a portion which overlies the defect (defective portion 26) is larger than a width of a portion which does not overlie the defect (defective portion 26). For example, during drawing of the drawing pattern, a modified drawing pattern is drawn on the resist overlying the mask film after the position adjustment using the alignment mark as a reference position for locating the location of the defect. A mask line pattern 30 is formed from the mask film 30*f* based on this drawing. Therefore, the mask film 30*f* becomes the mask line pattern 30.

The state as described above is shown in FIGS. 8A and 8B. FIG. 8A is a plan view viewed in the direction of arrow AA in FIG. 8B.

FIG. 8B is a sectional view of the mask of FIG. 8A along line G1-G2.

As shown in FIGS. 8A and 8B, a mask line pattern 30 and a modifying (correction) pattern 35 are formed as one continuous piece.

A fine-tune pattern may be conducted by a defect modifying (correction) device after the step S25. A defect modifying (correction) apparatus has, for example, a focused ion beam apparatus or an electron beam apparatus to locally modify the mask film 30.

Furthermore, the stacked film MLf is etched using the mask pattern as a mask as shown in FIG. 7 (step S26). Therefore, the stacked film MLf is processed to the pattern of the mask 110 which includes a plurality of line patterns 20.

In this sample, a drawing pattern which includes the modified (correction) pattern is drawn in the resist layer overlying the mask film 30*f*. Therefore, the impact of the defect can be controlled without forming the modifying (correction) pattern in another process.

In the extreme ultraviolet lithography (EUVL) process to manufacture a semiconductor device, for example, an EUV mask which has a multilayer film (layers reflective of EUV light) and a patterned shielding mask is used. The multilayer film on which molybdenum (Mo) thin films and silicon (Si) thin films are stacked is formed on the mask substrate. The patterned shielding mask includes, for example, tantalum. In an EUVL process, by using this EUV mask, transferring to the wafer may not be obtained with predetermined accuracy due to generating a shadow in the patterning direction. When oblique-incidence is conducted, the shadow may be generated because an absorbing body is so thick (shadowing effect). There is an EUV mask which is an attenuated multilayer type EUV mask to obtain a lower (less) shadowing effect. However, it is more difficult to modify a defect when using the attenuated multilayer type EUV mask than when using the pattern absorbing body type EUV mask because it is necessary to process the multilayer film directly during manufacturing the attenuated multilayer type EUV mask. In particular, it is difficult to process the multilayer film with high accuracy while maintaining the desired EUV reflection properties. A way to modify (correct) the defect by correcting the absorbing body is a common way. However, it is impossible to apply this way to modify the defect by correcting the absorbing body to the attenuated multilayer type EUV.

In the embodiment, for example, one of a plurality of line patterns 20 has a first portion which is wider than the other portion (second portion 20*b*).

As described above in each embodiment, a foreign material (particle 40) is shown as a sample of a defect which causes the phase defect. However, the phase defect may be caused by a convex portion on the substrate or a depression (concave) portion on the substrate. Below is a description of examples of the phase defect.

Figure 9A:
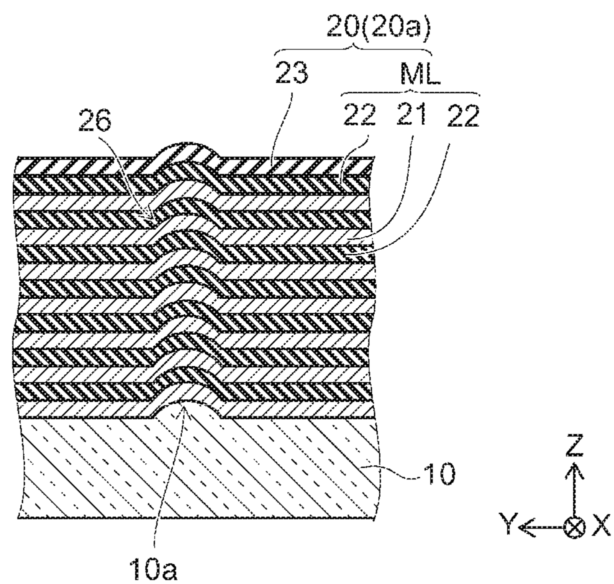
FIGS. 9A and 9B are schematic views of an example of a mask which has a defect.
Figure 9B:
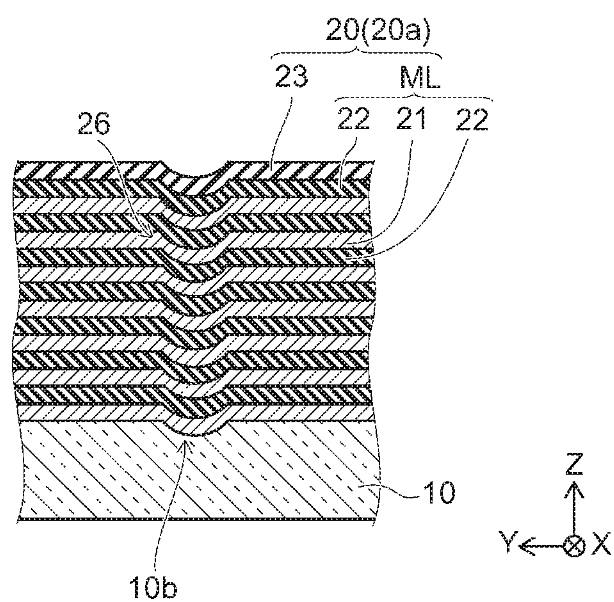

FIGS. 9A and 9B are schematic diagrams illustrating an example of a mask which has a defect.

As shown in FIG. 9A, in this sample, a phase defect is caused by a convex portion 10*a* on the substrate 10. In this case, at least a part of the phase defect (defective portion 26) overlies the convex portion 10*a* in the Z-direction. For example, a surface of the defective portion 26 has a convex shape. The convex portion may be formed in the line pattern 20 (first portion 20*a*).

As shown in FIG. 9B, the phase defect generated due to a depression (depression portion 10*b*) on the substrate 10. In this case, at least a part of the phase defect (defective portion 26) overlies the depression portion 10*b* in Z-direction. For example, a surface of the defective portion 26 has a shape of a depression. The depression portion 10*b* may be formed in a line pattern 20 (first portion 20*a*).

While certain embodiments have been described, these embodiments have been presented by way of example only, and are intended to limit the scope of the invention. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A mask comprising:

a plurality of line patterns provided on a substrate, the plurality of line patterns each including a line comprising a plurality of first layers and a plurality of second layers alternately stacked on the substrate, wherein the lines of the plurality of line patterns extend in a first direction and the lines of the plurality of line patterns are spaced in a second direction crossing the first direction; and a line of one of the plurality of line patterns has a first portion and a second portion on a side of the first portion in the first direction, the first portion wider than the second portion in the second direction.

2. The mask according to claim 1, wherein a first height of a first surface above the substrate in the first portion is different from a second height of a second surface above the substrate in the second portion.

3. The mask according to claim 2, wherein the first height is higher than the second height.

4. The mask according to claim 1, wherein a part of the first portion has a different height above the substrate than another part of the first portion.

5. The mask according to claim 1, wherein a distance between the first portion of the line and an adjacent line is 0.1 times to 0.8 times the distance between the second portion of the line and the adjacent line.

6. The mask according to claim 1, wherein the first layers include molybdenum and the second layers include silicon.

7. The mask according to claim 1, wherein the first portion includes a particle located between:

one of the first and second layers and the substrate, or one of the first layers and one of the second layers.

8. The mask according to claim 1, wherein the first portion includes a particle on the substrate.

9. The mask according to claim 1, wherein each line of the plurality of line patterns further comprise a third layer; and the first and second layers are provided between the third layer and the substrate.

10. The mask according to claim 9, wherein the third layer includes ruthenium.

* * * * *